United States Patent

Matsumaru et al.

[11] Patent Number: 5,903,156
[45] Date of Patent: May 11, 1999

[54] METHOD FOR DETECTING TROUBLE LOCATION IN WIRE HARNESSES AND WIRE HARNESS TO BE USED IN THE METHOD

[75] Inventors: Akio Matsumaru; Yoshiyuki Miyazaki; Motonori Kido, all of Nagoya, Japan

[73] Assignees: Sumitomo Wiring Systems, Ltd.; Harness System Technologies Research, Ltd.; Sumitomo Electric Industries, Ltd., all of, Japan

[21] Appl. No.: 08/774,885

[22] Filed: Dec. 27, 1996

[30] Foreign Application Priority Data

Jan. 10, 1996 [JP] Japan .................................. 8-002332

[51] Int. Cl.⁶ .................................................. G01R 31/11
[52] U.S. Cl. .......................... 324/533; 324/503; 324/532; 324/534; 324/538
[58] Field of Search ..................................... 324/503, 527, 324/532, 533, 534, 535, 538, 539, 541, 542, 66; 379/25, 26

[56] References Cited

U.S. PATENT DOCUMENTS

| 4,538,103 | 8/1985 | Cappon ................................... | 324/534 |
| 4,859,953 | 8/1989 | Young et al. ........................... | 324/539 |
| 5,066,919 | 11/1991 | Klassen et al. ......................... | 324/503 |
| 5,206,595 | 4/1993 | Wiggins et al. ........................ | 324/535 |
| 5,268,644 | 12/1993 | Klassen et al. ......................... | 324/503 |

FOREIGN PATENT DOCUMENTS

| 0450807 | 10/1991 | European Pat. Off. . |
| 2097214 | 10/1982 | United Kingdom . |

*Primary Examiner*—Diep N. Do
*Attorney, Agent, or Firm*—Jordan B. Bierman; Bierman, Muserlian and Lucas

[57] ABSTRACT

A method for detecting a trouble location in wire harnesses can easily detect a position of trouble such as breakage, short circuit, or the like in the wire harnesses without bringing enlargement and complication into the wire harnesses. This method includes the steps of: setting each of electric wires (2) in a main line part (4) and a branch line part (5) of a wire harness (1) as a sensing line, the wires (2) being juxtaposed to each other in the respective parts (4, 5); transmitting a pulse wave in a measuring line of a trouble electric wire in the wire harness and the sensing line corresponding to the measuring line at their ends by a pulse generating unit (11); receiving a pulse wave reflected at a trouble point and measuring a difference in time between the transmitted pulse wave and the reflected pulse wave by a synchroscope (12); and computing a distance from a measuring point to the trouble point in accordance with the difference in time and a pulse propagation velocity by a computing unit (13).

2 Claims, 6 Drawing Sheets

METHOD FOR DETECTING TROUBLE LOCATION IN WIRE HARNESSES AND WIRE HARNESS TO BE USED IN THE METHOD

BACKGROUND OF THE INVENTION

This invention relates to a method for detecting a trouble location of breakage, short circuit or the like in wire harnesses in an automotive vehicle, and to a wire harness to be used in the method.

Wire harnesses mounted in an automotive vehicle are subject to breakage or short circuit, for long time use of a car, due to interference with other parts caused by vibration during driving, wear of electric wires caused by mutual rubbing or deterioration of the wires caused by repeated bending upon opening and closing a door. When such troubles occur, electrical equipment will not operate. Heretofore, detection and repair of troubles in wire harnesses have been done by the following steps of:

(1) finding a trouble wire (circuit) by using a tester;

(2) searching electric wires arranged in an interior of an automotive vehicle by referring to a wiring circuit diagram and detaching all parts of the searched electric wire from the interior;

(3) extracting a wire harness secured to a car body by clamps or the like;

(4) detaching an exterior of the wire harness, and finding and repairing a faulty electric wire, for example, in the case of breakage of the wire, pressing a terminal onto the faulty portion, soldering it and insulating the connected portion with tape;

(5) returning the exterior of the wire harness to the original location, securing the wire harness to the car body by the clamps or the like and attaching all of the detached interior parts to the interior In such a common process, the step (1) cannot detect a faulty location, although it can find the trouble wire (breakage or short circuit) and the steps (2) to (5) involve a considerable amount of labor and time to find the broken portion.

Heretofore, in order to overcome such a problem, for example, Japanese Utility Model Public Disclosure No. HEI 4-22311 (1992) discloses an apparatus for detecting a broken location, in which a sensing electric wire is provided close to a conductive line in electric wires for electrical wiring, the sensing wire for breakage is connected to a first terminal of an adapter, each of the conductive lines is connected to a second, third . . . terminals, and a detector including first and second measuring units, an AC power source, and an amperemeter is provided. In this apparatus, the first and second measuring units are connected to the first terminal and to a terminal corresponding to the conductive line in breakage, and an AC voltage is applied across the measuring units. A distance from a reference point to a breakage point is determined by a current value flowing between the measuring units.

The apparatus disclosed in the Public Disclosure mentioned above detects the breakage location by means of a so-called capacitance measurement method and can make it easier than the common detecting method to detect the breakage location. However, since the sensing lines must be arranged to come into close contact with the conductive wires being measured, in the case of applying them to existing wire harnesses on an automotive vehicle, it is necessary to change the type of electric wire and to increase the number of wires. This results in a large wire harness. Consequently, there are several problems that it is difficult to define an arrangement space in the automotive vehicle, interference between ambient parts and the wire harness tends to be caused, and exterior parts for protecting the wire harness will be increased. Also, this apparatus cannot detect short circuit in the wire harness and can detect only breakage.

In an underground electric cable or the like, a pulse radar method mentioned after in detail has been known to detect breakage and short circuit. However, this method has been applied to an underground electric cable which is long and has no branch. It has been difficult heretofore to directly apply the method to a wire harness which is arranged in an automotive vehicle, is short and has branches on intermedium portions.

SUMMARY OF THE INVENTION

An object of the present invention is to easily detect a trouble location in wire harnesses, when any trouble such as breakage or short circuit is caused in electric wires in the wire harnesses, by effectively utilizing a so-called pulse radar method, without bringing enlargement and complication into the wire harnesses.

In order to achieve the above object, a method of detecting a trouble location in wire harnesses in accordance with the present invention, comprising the steps of: setting each of electric wires in a main line part and a branch line part of a wire harness as a sensing line, the electric wires being juxtaposed to each other in the main and branch line parts; setting an electric wire in trouble due to breakage or short circuit as a measuring line; transmitting a pulse wave in the measuring line and the sensing line corresponding to the measuring line at their ends; receiving a pulse wave reflected at a trouble point; measuring a difference in time between the transmitted pulse wave and the reflected pulse wave; and computing a distance from a measuring point to the trouble point in accordance with the difference in time and a signal propagation velocity.

According to this method, the so-called pulse radar method is effectively applied to a wire harness and when a trouble is caused in any electric wire in the wire harness it is possible to detect a trouble location in the electric wire easily and precisely.

In the method of the present invention, the measuring line and the sensing line are juxtaposed to each other. In the case where an object being measured is one of the electric wires branched from the main and branch line parts through a splice portion, the sensing line corresponding to the one electric wire is independent of the other electric wires. The sensing line is set to be an electric wire which meets the above conditions in the other electric wires except the measuring electric wire in the wire harness or in auxiliary sensing electric wires assembled in said wire harness. The wire harnesses are arranged so that a sensing line corresponding to each electric wire in a wire harness exists in the wire harness.

In the case where a trouble is caused in any electric wire in the wire harness, the detecting line corresponding to the trouble electric wire is selected from the wire harness to effectively detect the trouble location.

A structure of a wire harness to which the above method is applied comprises: an electrical connector connected to an end of each electric wire in the wire harness; and detecting connectors each connected to the given number of detecting electric wires branched from a portion near the ends of the electric wires.

Alternatively, an end of each electric wire in the wire harness is connected to the electrical wiring connector. A main wiring corresponding to each electric wire and a detecting wiring branched from the main wiring are provided in the connector or a member to be connected to the connector. The connector or the member is provided with a detecting connection portion having a terminal of an end of the detecting wiring.

According to these structure of the wire harness, it is possible to easily connect the terminals of a measuring device to the measuring line and detecting line upon detecting the trouble location by the pulse radar method in which the measuring device is used to transmit and receive a pulse wave.

The method of the present invention effects detection of a trouble location in a wire harness by utilizing the pulse radar method. Heretofore, the pulse radar method has been utilized in detection of a trouble location in an underground transmitting line and thus a principle of the pulse radar method has been known.

A wire harness which is arranged in an automotive vehicle or the like, however, is extremely shorter than the underground transmitting line. An error in detection of the trouble location in the wire harness must be exceedingly small. This requires a particular device in setting a pulse width, a period, and the like of a transmitting pulse.

Accordingly, the pulse width, period, and the like of the transmitting pulse may be preferably set as follows in consideration of a pulse propagation velocity and a length of a wire harness, which can be known by means of actual measurement, a possible measuring range of a trouble location to be required, and the like. That is, preferably, a pulse width A, a period B, and a duty ratio (A/B) of the pulse signal are set to be 0.049–0.976 n sec, 48.78 n sec, and 0.001–0.020, respectively.

DETAILED DESCRIPTION OF THE PREFERRED EMBODIMENTS

Figure 1:
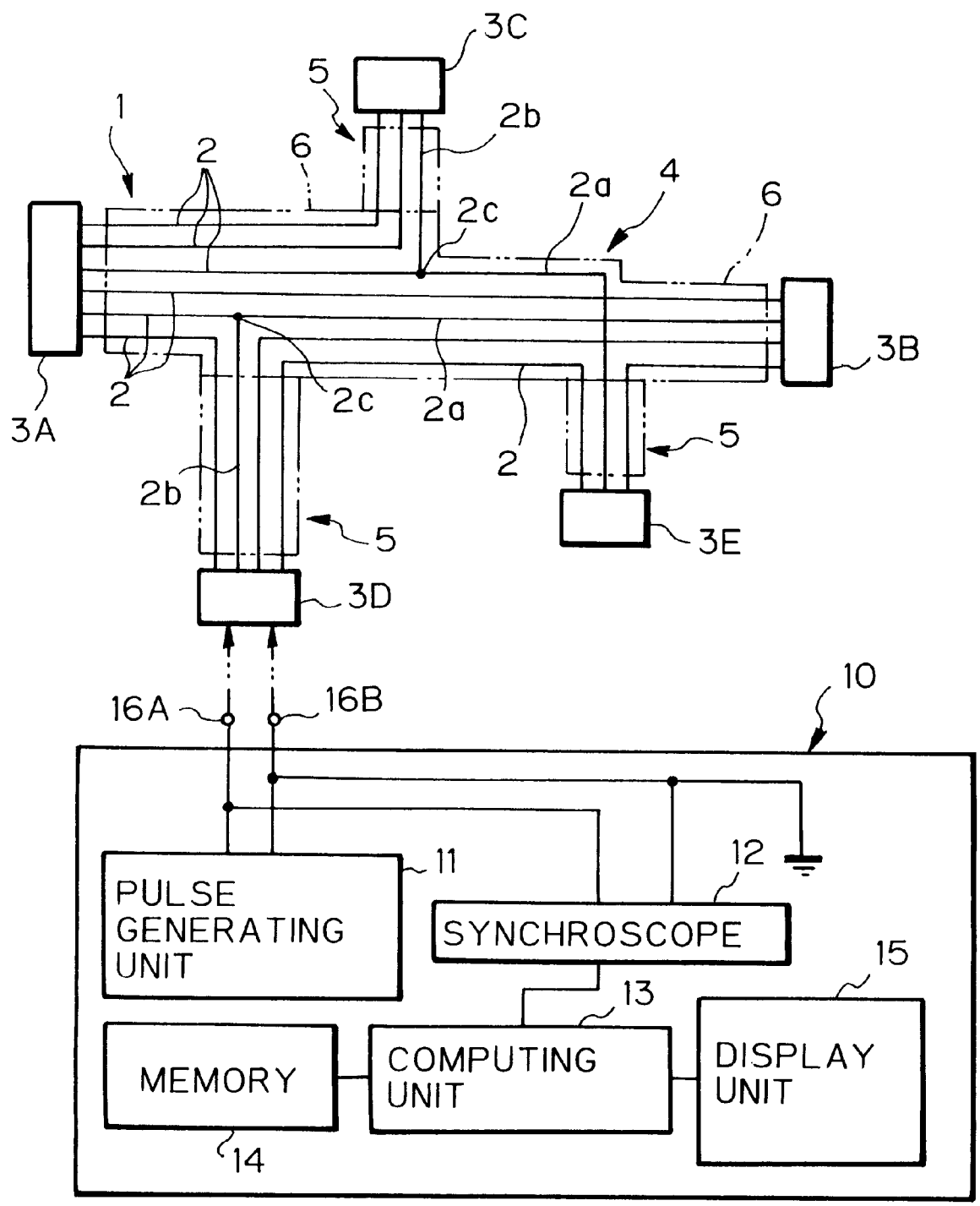
FIG. 1 is a schematic block diagram of a wire harness and a measuring device which are used in a method of the present invention.

Embodiments of a method for detecting a trouble location in wire harness and a wire harness to be used in the method will be described below by referring to the drawings.

FIG. 1 shows a schematic construction of a wire harness 1 and a measuring device 10 which are used in a method of the present invention. In FIG. 1 the wire harness 1 has a number of electric wires 2, which are arranged among a plurality (five in the drawings) of connectors 3A to 3E for electrical wiring. In the illustrated example, a main line part 4 is arranged between a first connector 3A and a second connector 3B and branch line parts 5, branch line parts 5 branched from the main line part 4 extend to third to fifth connectors 3C to 3E. A part of the electric wires 2 in the wire harness 1 includes main lines 2a and splice lines 2b branched from the main lines 2a through splice portions 2c.

Figure 2:
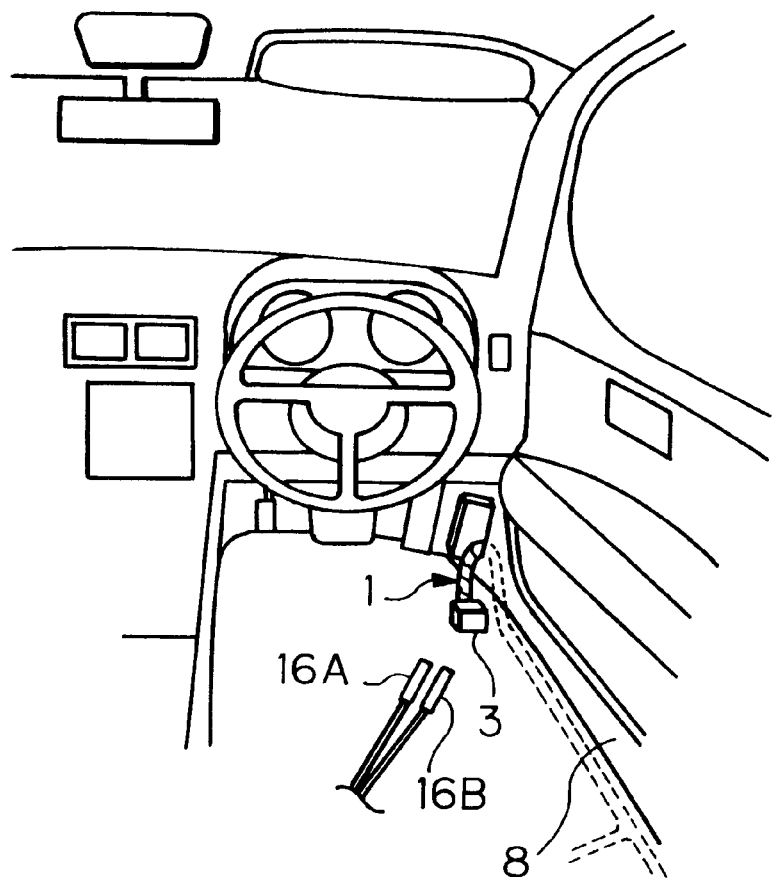
FIG. 2 is a fragmentary perspective view of an interior in an automotive vehicle, illustrating an arrangement of a wire harness in the interior.

The wire harness 1, as shown in FIG. 2, is arranged in a car body 8 of an automotive vehicle. A plurality of electric wires 2 are bundled in the main and branch line parts 4 and 5 and covered with sheath members 6 (FIG. 3), respectively.

Figure 3:
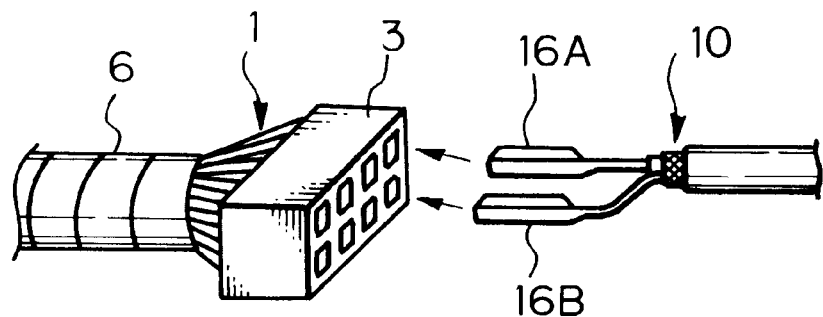
FIG. 3 is a perspective view of an end of a wire harness and terminals of the measuring device to be connected to the end.

A measuring device 10 which serves to detect a trouble location in the wire harness 1, as shown in FIG. 1 comprises a pulse generating unit 11, a synchroscope 12, a computing unit 13, a memory 14, a display unit 15, and a pair of terminals 16A, 16B. The pulse generating unit 11 and synchroscope 12 are connected to the pair of terminals 16A, 16B while one terminal 16B is connected to the ground. Upon detecting the trouble location, as shown in FIG. 3, the terminals 16A and 16B of the measuring device 10 is inserted into the connector 3 (any one of connectors 3A to 3E in FIG. 1) of the wire harness 1.

The method of the present invention detects a trouble location of the electric wire 2 in the wire harness 1 by using the pulse radar method and the measuring device 10. This method for detecting the trouble location will be explained below.

Figure 4:
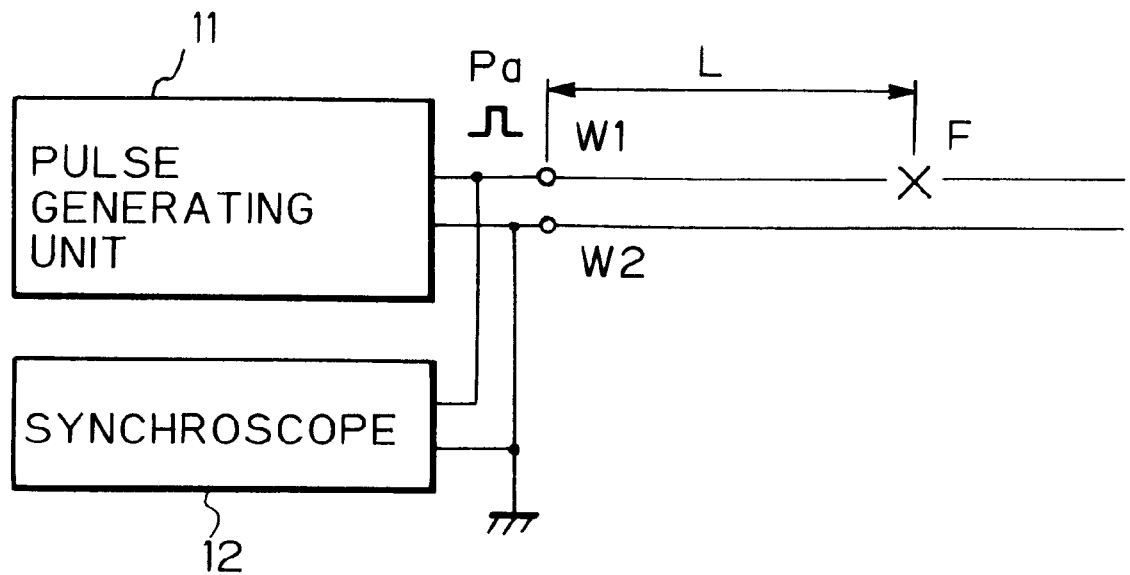
FIG. 4 is an explanatory view of a pulse radar method.

First of all, a principle of this pulse radar method will be explained by referring to FIGS. 4 and 5. Assuming that an electric wire 2 in a trouble such as breakage is a measuring line W1 and an electric wire extending in parallel with the measuring line W1 is a sensing line W2, both lines W1 and W2 are connected to the pulse generating unit 11, the sensing line W2 is connected to the ground, and a pulse wave Pa from the pulse generating unit 11 is transmitted in the lines W1 and W2 at their ends. Then, the pulse wave Pa propagates in the lines while being attenuated gradually in compliance with line characteristics. If there is in the line a portion in which a characteristic impedance is changed on account of breakage or short circuit in the line, the pulse wave Pa is reflected at the portion.

Assuming that L is a distance from an end of the line to a pulse reflecting portion (trouble location), v is a pulse propagation velocity, t is a pulse propagation time (a difference in time between a transmitted wave Pa and a reflected wave Pb), and $\epsilon$ is a dielectric constant in a line, the following equations (1) and (2) are given:

$$L = v \cdot t/2 \qquad (1)$$
$$v = 300/\sqrt{\epsilon} \qquad (2)$$

The pulse propagation time t can be measured by the synchroscope 22 in the measuring device 20. If the pulse propagation velocity v or the dielectric constant $\epsilon$ is given beforehand, for example, if the pulse propagation velocity v is given by measuring the pulse propagation time t in a normal state and a line length, the distance L can be obtained from the pulse propagation velocity v and the measured value of the pulse propagation time t.

An amplitude and a polarity of the reflected wave Pb is determined by a reflection constant m given by the following equation (3).

$$m = (Ze-Zo)/(Ze+Zo) \quad (3)$$

here,
Ze: characteristic impedance at a reflection point
Zo: characteristic impedance in a line
If there is breakage in a line, the following equations (4) and (5) are given.

$$Ze \to \infty \quad (4)$$

$$m = (1-Zo/Ze)/(1+Zo/Ze) \to +1 \quad (5)$$

If there is short circuit in a line, the following equations (6) and (7) are given.

$$Ze \to 0 \quad (6)$$

$$m = (Ze-Zo)/(Ze+Zo) \to -1 \quad (7)$$

Figure 5:
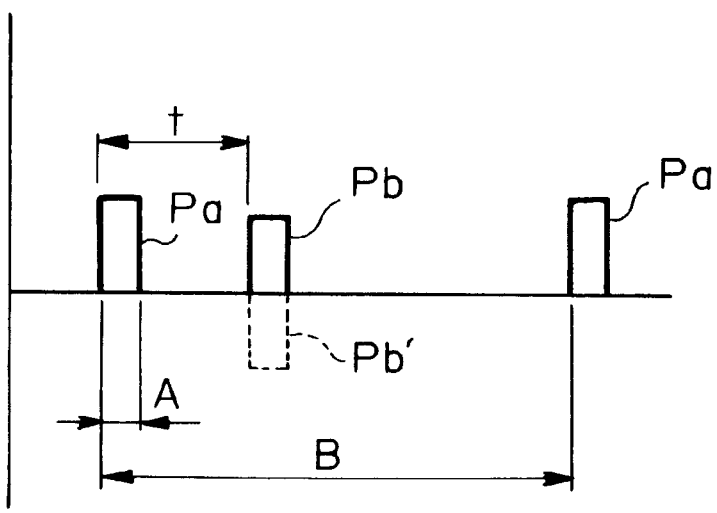
FIG. 5 is a graph illustrating transmitted pulses and a reflected pulse in the pulse radar method.

That is, as shown in FIG. 5, the reflected wave Pb (solid line in FIG. 5) on the occasion of breakage has the same polarity as the transmitted wave Pa while the reflected wave Pb' (dotted line in FIG. 5) on the occasion of short circuit has the reverse polarity to the transmitted wave Pa. Accordingly, it is also possible to determine whether the trouble in the line is breakage or short circuit in accordance with the polarity of the reflected wave.

Heretofore, the pulse radar method has been utilized in detection of a trouble point in an underground transmitting line and thus a principle of the pulse radar method has been known.

A wire harness which is arranged in an automotive vehicle or the like, however, is extremely shorter than the underground transmitting line. An error in detection of the trouble location in the wire harness must be exceedingly small. This requires a particular device in setting a pulse width, a period, and the like of a transmitting pulse. Also, the wire harness generally includes a number of electric wires provided in the main line part 4 and branch line part 5, as shown in FIG. 1 and particularly the electric wires branched from the main line 4 through the splice portions 2c. A particular device is required to effectively detect a trouble point in an electric wire having a splice portion 2c.

Accordingly, the pulse width, period, and the like of the transmitting pulse may be preferably set, as shown in Table 1, in consideration of a pulse propagation velocity and a length of wire harness, which can be known by means of actual measurement, a possible measuring range of a trouble location to be required, and the like.

TABLE 1

| Distance from a measuring point to a start point capable of measuring a trouble location [cm] | Pulse width A [n sec] | Period B [n sec] | Duty ratio (A/B) |
| --- | --- | --- | --- |
| 1 | 0.049 | 48.78 | 0.001 |
| 5 | 0.244 | " | 0.005 |
| 10 | 0.488 | " | 0.010 |
| 15 | 0.732 | " | 0.015 |
| 20 | 0.976 | " | 0.020 |

As described above in association with the equation (1), the pulse radar method can compute the breakage location by dividing the products of the reflection time by the pulse propagation velocity into halves. Accordingly, in order to make the pulse propagation velocity known, the measuring device 20 measured the most standard cable (two parallel lines). Consequently, the pulse propagation velocity was 205 m/μsec.

It is desirable to set the period B of the transmitted wave to be greater than the maximum of the pulse propagation time in the wire harness on the vehicle, since a lap between a reflected wave and a next transmitted wave will make the measurement difficult in the case where the above measurement is effected by transmitting a pulse wave at a certain period. Accordingly, assuming that the maximum length of the wire harness on the vehicle is 10 m, the period B of the transmitted wave will be 48.78 n sec by dividing 10 m by 205 m/μsec.

Since a transmitted wave Pa overlaps on a reflected wave Pb and this will make the measurement of the pulse propagation time difficult when a difference in time between the transmitted wave Pa and the reflected wave Pb is smaller than the pulse width A of the transmitted wave, it is necessary to set the pulse width A to be small in order to shorten a distance from a measuring point to a start point capable of measuring a trouble location. When the pulse propagation velocity is set to be 205 m/μsec and the period B of the transmitted wave is to be 48.78 n sec, the above Table 1 shows a relationship between the distance from the measuring point to the start point capable of measuring the trouble location, and the pulse width A and the duty ratio (A/B).

It is possible to set the pulse width A in compliance with a measuring range of a trouble location on the basis of the above data.

An electric wire parallel to a main line and a branch line is set as a sensing line for each electric wire 2 in the wire harness 1. In this case, if an electric wire meets the following conditions, the electric wire is set as a sensing line. The conditions are the fact that if the electric wire 2 has a splice portion 2c branching the main and branch lines, the measuring and sensing lines are juxtaposed to each other and the fact that the sensing line corresponding to one of the main and branch lines is independent of the other line.

Figure 6A:
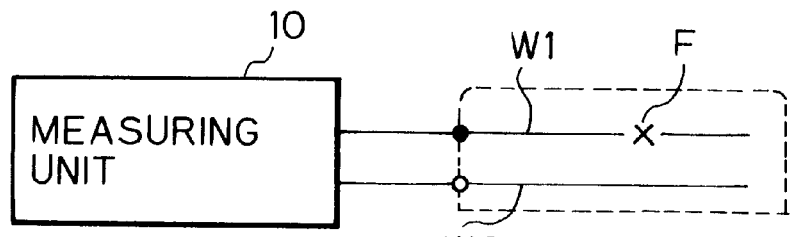
FIG. 6 shows examples of wiring a measuring line and a sensing line in accordance with the pulse radar method, FIGS. 6(a), 6(b) and 6(c) being examples of the wiring capable of measuring and FIG. 6(d) being an example of the wiring in a difficult state of measurement.
Figure 6B:
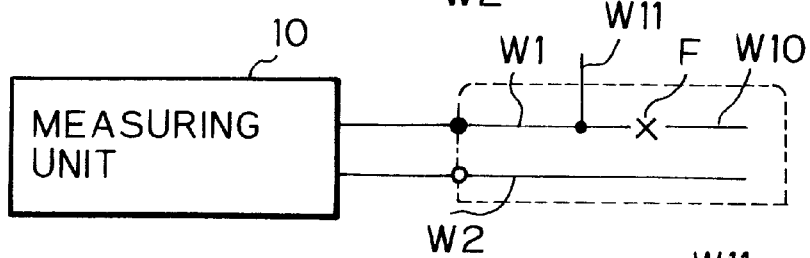
Figure 6C:
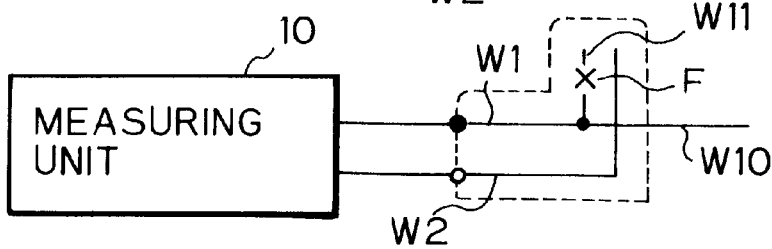

In more detail, if the measuring line W1 is a single line having no splice portion, as shown in FIG. 6(a), it is possible to detect a trouble location at a trouble point A by setting a line parallel to the measuring line W1 (a line on the same path as the measuring line W1) to be the sensing line W2 and by using the pulse radar method. If the measuring line W1 has a splice portion, that is, if the measuring line W1 has a main line W10 and a splice line (branch line) W11 branched from the main line W10, it is possible to detect the trouble location at the trouble point F in the main line 10 by setting a line parallel with the main line W10 of the measuring line W1 as the sensing line W2, as shown in FIG. 6(b). It is also possible to detect the trouble location in the splice line W11 by setting a line parallel with the splice line W11 of the measuring line W1 as the sensing line W2, as shown in FIG. 6(c).

Figure 6D:
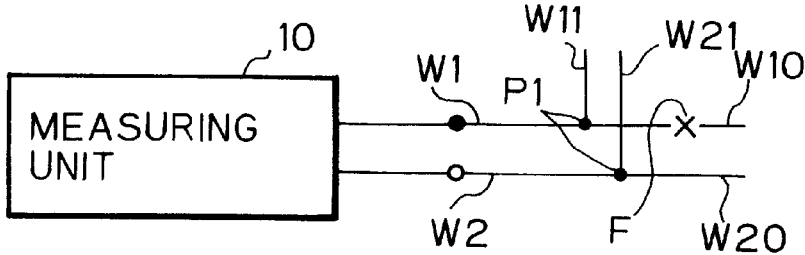

However, as shown in FIG. 6(d), if the measuring line W1 has the main line W10 and the splice line W11 and the sensing line W2 has a main line W20 and a splice line W21 in the same path as the main line 10 and splice line W11 in the measuring line W1, it is difficult to detect the trouble location by the pulse radar method. The reason is as follows:

Assuming that a line path including both lines W1 and W2 is an ideal cable, a characteristic impedance Zo of the line path is given by the following equation (8)

$$Zo = \sqrt{L/C} \quad (8)$$

A characteristic impedance R1 at a splice point P1 taken from an end side of the line path is given by the following equation (9), since a C capacitance and an L capacitance are changed to 2 times and ½ times, respectively.

$$Rl = (1/2) \cdot \sqrt{L/C} \qquad (9)$$

Accordingly, the reflection constant m is given as follows by the equation (7) mentioned above.

$$m = (Rl - Zo)/(Rl + Zo)$$
$$= \{(1/2)Zo - Zo\}/\{(1/2)Zo + Zo\}$$
$$= -1/3$$

That is, in the case where a pulse wave is transmitted from an end, a pulse wave reflected at the splice point P1 has a reversed polarity with respect to the transmitted pulse wave.

Since the characteristic impedance is infinitely great (see the equation (4)) and the reflection constant m is +1 (see the equation (5)) at a terminal end of the splice line, a pulse wave reflected at the end of the splice line has the same polarity as the transmitted pulse wave.

In the case shown in FIG. 6(d), the measuring device 10 receives the pulse waves reflected at the trouble point F, splice point P1 and terminal end of the splice line. Confusion of these reflected pulse waves will make it difficult to detect the trouble location at the trouble point. In the case where the measuring and sensing lines have splice portions, respectively, it is possible to detect the trouble location at the trouble point F in the main line W10 if branch positions and branch directions of the respective splice line.

Figure 7:
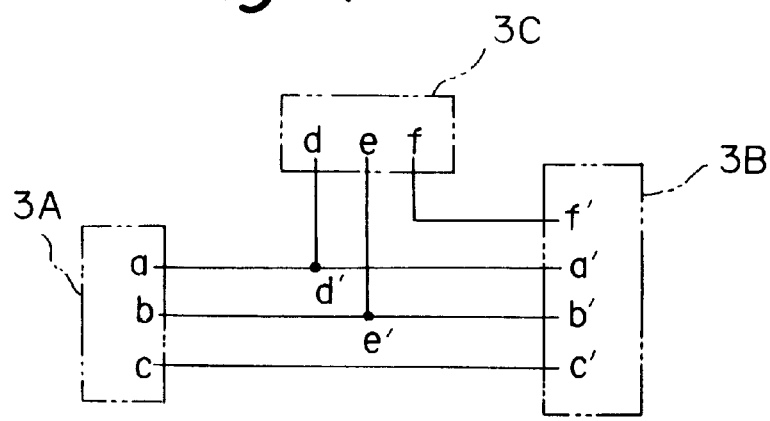
FIG. 7 is a schematic construction view of wiring of a wire harness.

Selection of the sensing line in the wire harness 1 in consideration of the above conditions will be explained below by referring to a circuit of a wire harness shown in FIG. 7 schematically.

The circuit shown in FIG. 7 includes a first set of electric wires having a main line (a-a') and a splice line (d-d'), a second set of electric wires having a main line (b-b') and a splice line (e-e'), a third electric wire (c-c') having no splice portion, and a fourth electric wire (f-f') having no splice portion. The main lines (a-a', b-b') of the first and second sets of electric wires and the third electric wire (c-c') are arranged on a main line part between connectors 3A and 3B. The splice lines (d-d', e-e') of the first and second sets of electric wires extend to a connector 3C through a branch line part. The fourth electric wire (f-f') is arranged through the main and branch line parts between the connectors 3A and 3C. In this circuit, a line which meets the conditions shown in FIGS. 6(a) to 6(c) in compliance with a trouble section is set as a sensing line. Table 2 shows a relationship between the trouble section and the sensing line.

TABLE 2

| Trouble Section | Sensing Line |
| --- | --- |
| a–a' | c–c' |
| b–b' | c–c' |
| c–c' | a–a' or b–b' |
| d–d' (–a') | f–f' |
| e–e' (–b') | f–f' |

Thus, when any electric wire 2 in the wire harness 1 causes a fault or a trouble, an electric wire in association with the faulty electric wire (measuring line) is set as a sensing line beforehand. In the case where any electric wire 2 in the wire harness 1 is set as a measuring line, an arrangement of the wire harness 1 is set so that a sensing line corresponding to the measuring line exists in the wire harness 1. In this case, a sensing line for each electric wire 2 is set as a rule out of the other electric wires in the wire harness 1. An auxiliary electric wire for exclusive use of sensing may be assembled in a circuit construction of the wire harness, if desired. For example, in the case where only one electric wire is branched in the branch line part, there is no other electric wire to be a sensing wire to the one electric wire. In this case, an auxiliary electric wire may be assembled in the branch line part so that the auxiliary electric wire passes through the branch line part in parallel with the one electric wire.

The detection of a trouble location in the electric wire 2 in the wire harness 1 on an automotive vehicle is carried out by the following manners.

In the case where any electrical equipments are brought into faultiness on account of a trouble in wire harnesses, first of all the trouble wire harness 1 associated with the faulty is searched and then an electric wire 2 in trouble in the wire harness 1 is found by a tester. A connector or connectors on the wire harness 1 (at least a connector connected to the trouble electric wire) is detached from a mating connector. The trouble electric wire 2 is set to be a measuring line. The terminals 16A and 16B of the measuring device 10 are inserted into the connector so that the terminals 16A and 16B are connected to the measuring line and the sensing line corresponding to the measuring line.

When the measuring device 10 is actuated under this state, the pulse generating unit 11 in the device 10 transmits a pulse wave in a wire harness 1 as described above and the synchroscope 17 measures a time t in which a reflected wave turns back from a trouble point to the transmitting point. The computing unit 13 computes a distance L from the transmitting point to the trouble point by giving to the above equation (1) the time t and the known pulse propagation velocity v. Whether the trouble is breakage or short circuit can be judged on the basis of a polarity of the reflected wave with respect to that of the transmitted wave.

The distance L, breakage, and short circuit are indicated on the display unit 15. An operator can know the trouble location from the distance L indicated on the display unit 15 and can readily repair the wire harness.

According to this method, it is possible to easily detect the trouble location of the electric wire 2 in the wire harness 1. This will enable to repair the harness by removing the minimum section of an interior and a wire harness in an automotive vehicle in a trouble location, thereby shortening a working time and working steps.

Since a sensing line for a measuring line is set out of the other electric wires in the wire harness 1 in principle, it is not necessary to sharply alter an arrangement of the existing wire harness 1 or add another wire harness thereto, thereby preventing a diameter of the wire harness from increasing.

Further, since a judgement of breakage or short circuit in the trouble can be effected, the method of the present invention is effective in grasping a cause of trouble.

Although the detection of a trouble location is effected by connecting the terminals 16A and 16B of the measuring device 10 to the trouble measuring line and the sensing line corresponding to the measuring line after the trouble electric wire has been found from the wire harness 1 by using a tester, in the above embodiment, each electric wire in the wire harness 1 may be set as each measuring line by exchanging a connection of the terminals 16A and 16B in order and the measuring device 10 may detect a trouble electric wire. It is also possible to automatically and effectively detect a trouble electric wire and a trouble location by providing a connector in the measuring device 10 and by coupling the connector to a connector for the wire harness 1.

Figure 8A:
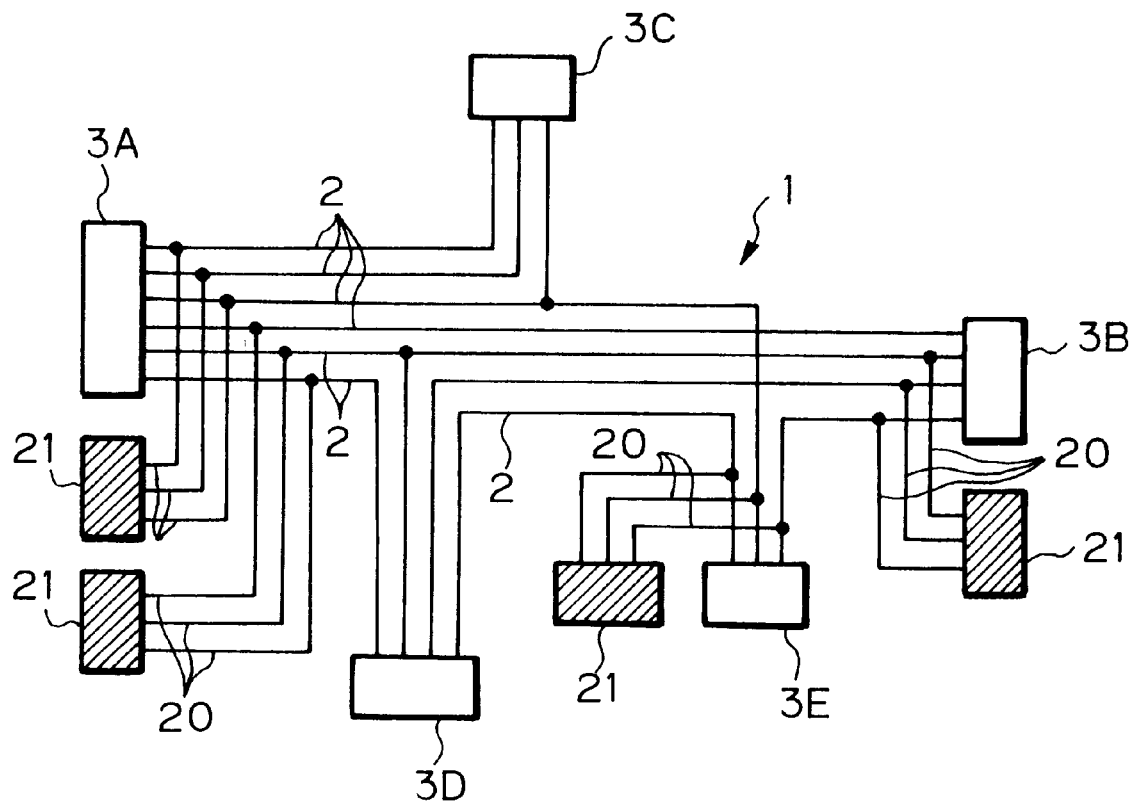
FIGS. 8(a) and 8(b) are similar views of FIGS. 1 and 3, FIG. 8(a) being a schematic block diagram of another embodiment of a wire harness and FIG. 8(b) being a perspective view of a measuring connector of a wire harness in the embodiment and terminals of the measuring device to be connected to the connector.
Figure 8B:
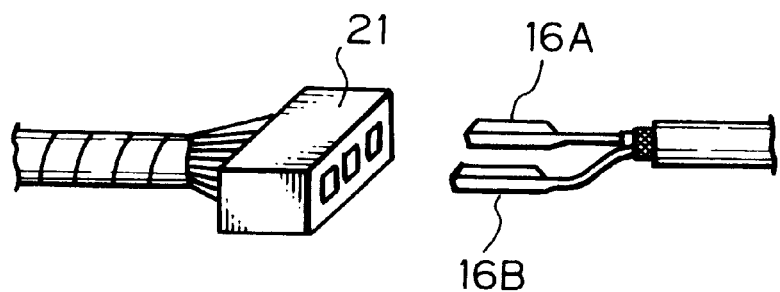

FIG. 8 shows another embodiment of a wire harness to be used in the method of the present invention. In this embodiment, an end of each electric wire 2 in the wire harness is connected to each electrical wiring connectors 3A to 3E while a detecting electric wire 20 is branched in the vicinity of an end of each electric wire 2. A plurality of sets of the given number of electric wires 2 are connected to detecting connectors 21 independent of the electrical wiring connectors 3A to 3E, respectively.

In the embodiment shown in FIG. 8(a), the detecting electric wires 20 are branched from six electric wires 2 in the vicinity of the connector 3A, respectively. Each set of three detecting electric wires 20 is connected to each detecting connectors 21. Further, the detecting electric wires 20 branched from three electric wires 2 near the connector 3B and the detecting electric wires 20 branched from three electric wires 20 near the connector 3E are connected to the respective detecting connector 21. The electric wires 2 in the mutual relationship between the measuring line and the sensing line are connected through the detecting electric wires 20 to the same detecting connector 21.

In the case of using such wire harness 1, detecting of the trouble location can be effected by the same manner of the first embodiment which uses the measuring device 10 in accordance with the pulse radar method. It will be easier than a conventional method to select connection portions for the terminals 16A and 16B of the measuring device 10 upon connecting the terminals 16A and 16B to the electric wires 2 to be set as the measuring and sensing lines, since each set of the given electric wires are connected to each detecting connector 21.

Figure 9:
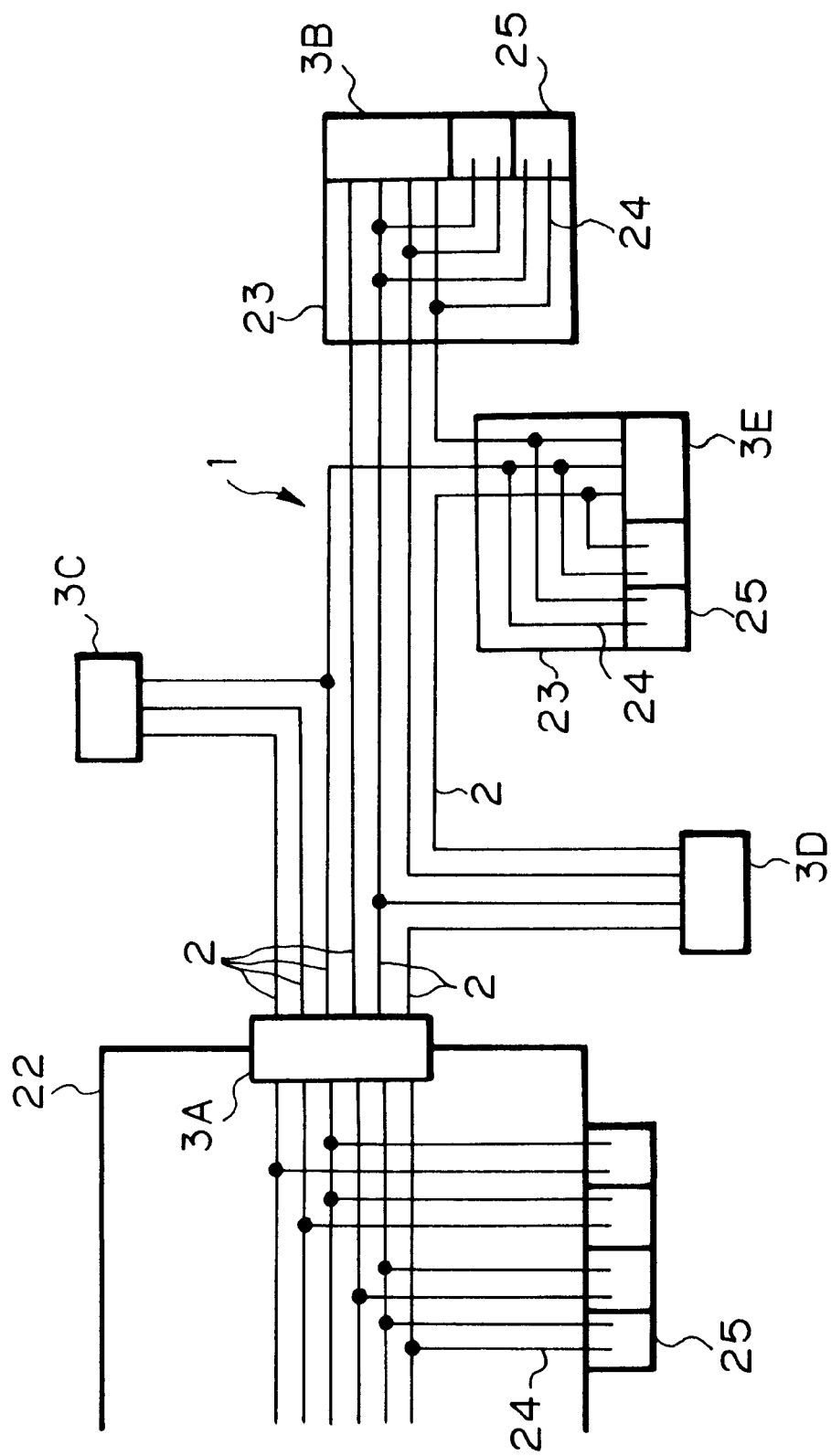
FIG. 9 is a similar view of FIG. 8(a), illustrating further another embodiment of a wire harness.

FIG. 9 shows another embodiment of a wire harness to be used in the method of the present invention. In this embodiment, an end of each electric wire 2 in the wire harness 1 is connected to each of the electrical wiring connectors 3A to 3E while detecting wiring 24 branched from a main wiring corresponding to each electric wire 2 are formed of bus bars or the like in a joint box 22 connected to the connector 3A or in wiring parts 23 provided in the connectors 3B and 3E. Terminals at ends of the wirings 24 are juxtaposed in pair in the joint box 22 and detecting connection parts provided in the connectors 3B and 3E. The detecting wirings 24 are constructed so that each pair of terminals become the respective measuring and sensing lines.

It is possible to more easily connect the terminals 16A and 16B to the respective measuring and sensing lines by using such wire harness 1 upon detecting the trouble location by using the measuring device 10 in accordance with the pulse radar method.

In the method of the present invention, the following steps are carried out: setting each of electric wires in a main line part and a branch line part of a wire harness as a sensing line, the electric wires being juxtaposed to each other in the main and branch line parts; setting an electric wire in trouble due to breakage or short circuit as a measuring line; transmitting a pulse wave in the measuring line and the sensing line corresponding to said measuring line at their ends; receiving a pulse wave reflected at a trouble point; measuring a difference in time between the transmitted pulse wave and the reflected pulse wave; and computing a distance from a measuring point to the trouble point in accordance with the difference in time and a signal propagation velocity. Accordingly, it is possible to easily and precisely detect the trouble location in the electric wire in the wire harness while maintaining the wire harness in a relatively simple construction by applying the pulse radar method to detection of the trouble location in the wire harness.

In the method of the present invention, the measuring line and the sensing line are juxtaposed to each other. In the case where an object being measured is one of the electric wires branched from the main and branch line parts through a splice portion, the sensing line corresponding to the one electric wire is independent of the other electric wires. The sensing line is set to be an electric wire which meets the above conditions in the other electric wires except the measuring electric wire in the wire harness or in auxiliary sensing electric wires assembled in the wire harness. The wire harnesses are arranged so that a sensing line corresponding to each electric wire in a wire harness exists in the wire harness. Consequently, it is possible to effectively detect the trouble location in the wire harness while maintaining the wire harness in a simple construction and avoiding increase of a diameter of the wire harness.

What is claimed is:

1. A method for detecting a fault in a wire harness, said harness having a main line and at least one branch line, a main plurality of sensing wires in said main line and a branch plurality of sensing wires in said branch line, said main plurality of sensing wires being juxtaposed to each other, said branch plurality of sensing lines being juxtaposed to each other, a measuring wire having said fault in said main line or said branch line, said measuring wire juxtaposed to said main plurality or said branch plurality;

transmitting a pulse wave in said measuring wire and a random one of said sensing wires at ends thereof;

receiving a pulse wave reflected at said fault;

measuring a difference in time between said transmitted pulse wave and said reflected pulse wave; and computing a distance from a measuring point to said fault based on said difference in time and a signal propagation velocity.

2. A method for detecting a fault in a wire harness, said harness having a main line and at least one branch line connected to said main line by a splice, a main plurality of sensing wires in said main line and a branch plurality of sensing wires in said branch line, a measuring wire in said main line and said branch line having said fault in branch line with said splice between said fault and said main line, an independent wire in said main line and said branch line in juxtaposition to said measuring wire, transmitting a pulse wave in said measuring wire and a random one of said sensing wires at ends thereof;

receiving a pulse wave reflected at said fault;

measuring a difference in time between said transmitted pulse wave and said reflected pulse wave; and computing a distance from a measuring point to said fault based on said difference in time and a signal propagation velocity.

* * * * *